US00RE37100E

(19) United States
(12) Reissued Patent
Greenly

(10) Patent Number: US RE37,100 E
(45) Date of Reissued Patent: Mar. 20, 2001

(54) PULSED ION BEAM SOURCE

(75) Inventor: John B. Greenly, Lansing, NY (US)

(73) Assignee: Sandia Corporation, Albuquerque, NM (US)

(21) Appl. No.: 09/095,611

(22) Filed: Jun. 11, 1998

Related U.S. Patent Documents

Reissue of:
(64) Patent No.: 5,525,805
Issued: Jun. 11, 1996
Appl. No.: 08/340,519
Filed: Nov. 16, 1994

U.S. Applications:

(63) Continuation-in-part of application No. 08/317,948, filed on Oct. 4, 1994, now Pat. No. 5,532,495, which is a continuation-in-part of application No. 08/153,248, filed on Nov. 16, 1993, now Pat. No. 5,473,165.

(51) Int. Cl.[7] ..... H01J 27/00
(52) U.S. Cl. ..... 250/423 R; 315/111.41
(58) Field of Search ..... 250/423 R, 424; 315/111.21, 111.41, 111.81, 111.71

(56) References Cited

U.S. PATENT DOCUMENTS 4,721,889 * 1/1988 Seidel et al. ..... 250/423 R

OTHER PUBLICATIONS

"Production and Postacceleration of Intense Ion Beams in Magnetically Insulated Gaps", S. Humphries, et al., J. Appl. Phys. 51(4), Apr. 1980, pp. 1876–1895.

"Pulsed Plasma Guns for Intense Ion Beam Injectors", S. Hamphries, et al., Rev. Sci. Instrum. 52 (2), Feb. 1981, pp. 162–171.

"Magnetically Insulated Ion Diode with a Gas–Breakdown Plasma Anode", J.B. Greenly, et al., Proc. 6th Int'l. Conf. on High Power Particle Beams, Osaka Japan, 1986, pp. 196–199.

"Magnetically Insulated Ion Diode with a Gas–Breakdown Palsma Anode", J.B. Greenly, et al., J. Appl. Phys. 63(6), Mar. 15, 1998, pp. 1872–1876.

"Plasma–Anode Ion Diode Research as Cornell: Repetitive–Pulse, and 0,1 T.W. Single–Pulse Experiments", J.B. Greenly, et al., Proc. 8th Int'l. Conf. on High Power Particle Beams, Novosibirsk, USSR, 1990, pp. 199–206.

"Investtigation of High Power Ion Beam Generation in B–Applied Diode with Plasma Source at the Anode", S.N. Volkov, et al., Proc. 8th Int'l. Conf. on High Power Particle Beams, Novosibirsk, USSR, 1990, pp. 529–534.

"Inductively Driven Gas–Breakdown Plasma Source for Intense Ion Beam Production", M. Ueda, et al., Rev. Sci. Instrum. 64(10), Oct. 1993, pp. 2737–2745.

"Design and Operation of a High Pulse Rate Intense Ion Beam Diode", W.A. Noonan, et al., Rev. Sci. Instrum. 66(6), June 1995, pp. 3448–3458.

"Intense Ion Beam from a Magnetically Insulated Diode with Magnetically Controlled Gas–Breakdown Ion Source", M. Ueda, et al., Laser and Particle Beams, 1994, vol. 12, No. 4, pp. 585–614.

* cited by examiner

*Primary Examiner*—Kiet T. Nguyen
(74) *Attorney, Agent, or Firm*—McDermott, Will & Emery

(57) ABSTRACT

An improved magnetically-confined anode plasma pulsed ion beam source. Beam rotation effects and power efficiency are improved by a magnetic design which places the separatrix between the fast field flux structure and the slow field structure near the anode of the ion beam source, by a gas port design which localizes the gas delivery into the gap between the fast coil and the anode, by a pre-ionizer ringing circuit connected to the fast coil, and by a bias field means which optimally adjusts the plasma formation position in the ion beam source.

55 Claims, 6 Drawing Sheets

PULSED ION BEAM SOURCE

Matter enclosed in heavy brackets [ ] appears in the original patent but forms no part of this reissue specification; matter printed in italics indicates the additions made by reissue.

This application is a continuation-in-part of U.S. patent application Ser. No. 08/317,948 filed Oct. 4, 1994, *now U.S. Pat. No. 5,532,495,* which is a continuation-in-part of U.S. patent application Ser. No. 08/153,248 filed Nov. 16, 1993, *U.S. Pat. No. 5,473,165*.

The United States Government has rights in this invention pursuant to Contract No. DE-AC04-76DP00789.

FIELD OF THE INVENTION

This invention relates generally to apparatus for producing ion beams. More particularly it relates to magnetically-confined anode plasma (MAP) ion sources. Still more particularly, it relates to such MAP ion sources as are designed to produce minimum ion beam rotation and precise control over the ion species present in the beam.

BACKGROUND

A variety of ion beam sources exist. MAP ion sources are particularly interesting because of their ability to shield the ion source structure from the destructive effects of the ion plasma by the magnetic shielding created by the magnetic structure of the MAP ion source.

However, most of the prior art MAP ion sources were designed to be used in a beam line that also included downstream steering and confinement of the produced ion beams by various electric and/or magnetic fields. This steering and confinement was necessary because of the beam rotation created by the magnetic structure of these MAP ion sources which imparted significant rotation to the produced ion beam. The downstream electric and/or magnetic fields add complexity, size and expense to a system employing such MAP ion sources.

An example of such a prior art MAP ion beam source, often called an ion diode, is found in a paper by the inventor of the present invention, Greenly, J. B. et al., "Plasma-Anode Ion Diode Research at Cornell: Repetitive-Pulse, and 0.1 TW Single Pulse Experiments," Proceedings 8th International Conf. on High-Power Particle Beams, pp. 199–206, Novosibinsk, USSR, July, 1990. The RRID ion diode described therein bears some similarity to the present invention, but its magnetic design is such that substantial beam rotation is imparted to the produced ion beam.

It would be desirable to reduce or eliminate the need for such downstream apparatus by designing a new MAP ion source that had minimal or no beam rotation as a result of the creation and acceleration of the ion beam by the ion beam source.

MAP ion beam sources have a variety of uses. The most obvious is use in conventional ion implantation processes. However, a need for a capability to do surface treatments to large areas of various materials with high power, short pulse ion beams has arisen that required a new type of MAP ion beam source with minimal or no beam rotation and precise control over the ion species used. The use of surface treatments to improve properties such as surface hardness, wear resistance, corrosion resistance, and fatigue lifetime add significant value to a wide range of products in industries including automobile manufacture, aerospace, microelectronics, tool and die manufacture, power generation, and the production of steel, aluminum, ceramics, and plastics. This unmet need was the impetus for the creation of the invention disclosed herein.

Although experiments with prior art ion diode sources have indicated that ion beams might be useful for these sort of surface treatments, no commercial implementations have resulted. The use of ion beams for thermally altering the near surface characteristics of a material has been fraught with substantial problems. Most notable of the limitations with existing ion beam technologies have been: 1) high costs per area treated; 2) the inability to generate a large number of pulses without the costly replacement of ion beam generator components; 3) low repetition rates; 4) low average power; and 5) the inability to reliably produce a uniform ion beam of a single selectable ion species.

Typical ion beam generators use dielectric surface arcing on an anode as a source of ions and thereafter magnetically or geometrically direct and focus the generated ion beam onto the material of interest. This surface arcing (also called "flashover") destroys the anode surface in less than 100 pulses, and produces a mixed species of ions that cannot be adjusted. Other difficulties arising from flashover include: production of large quantities of neutral gas that makes high repetition rate difficult, generation of debris which can contaminate surfaces being treated, and non-uniformity and irreproducibility of the beam in some cases due to the localized and difficult to control nature of flashover, as well as the detrimental beam rotation discussed above.

State-of-the-art ion beam generators are typically "one shot" devices, i.e., they operate at low repetition rates (<<1 Hz). Existing ion beam generators cannot be operated at high repetition rates (>>1 Hz) for a number of reasons. First, existing pulsed power supplies are not able to generate electrical pulses at high repetition rates having the voltage, pulse width (i.e., nominal temporal duration), and power required to generate the ion beams needed (i.e., consistent with the discussion above) for the various beneficial applications described herein. This limitation renders commercial exploitation impractical. However, it should be noted that one shot surface treatments from a robust ion beam source are useful in some applications. Second, the design of existing ion beam generators does not allow repetitive operation for an extended number of operating cycles ($>>10^3$) without replacement of major components. This limitation would require a maintenance time—manufacturing time ratio incompatible with routine manufacturing operations. Third, existing ion beam generators generally operate with electrical efficiencies <5%, thus presenting major challenges to the pulsed power supply and the cooling system of the generator. These limitations and others have made it impossible to routinely utilize the ion beam technology described above for surface treating materials.

SUMMARY OF THE INVENTION

The present invention provides a new type of magnetically-confined anode plasma ion beam source. The new MAP ion diode has improvements in a number of areas. Its magnetic fields are designed to have a profile such that the separatrix (B=0) between the fast coil field and the slow coil field is located near the anode to minimize or eliminate ion beam rotation. The gas nozzle is designed to produce a high mach number (supersonic) gas flow rate to efficiently localize the gas puff introduced into the ionizing region proximate the fast coil. Means are also provided to create an adjustable bias field to control the formation position of the plasma. A fast ringing field is imposed on the gas puff as it is delivered to the ionizing region to pre-ionize the gas.

These and other improvements contribute to the MAP ion beam source of this invention.

The use of the MAP ion diode of this invention for large scale surface treatment processes requires a pulsed high power source. Some of the detailed description below will be devoted to one such source, the Repetitive High Energy Pulsed Power (RHEPP) system developed at Sandia National Laboratories. For single shot applications other power sources such as Marx generators could also be used.

Further detail concerning the present invention and its scope will become apparent from the detailed discussion of specific embodiments presented below. However, it should be understood that the detailed description and specific examples, while representing the class of embodiments of the invention and its uses, are given by way of illustration only, since various changes and modifications within the spirit and scope of the invention will be apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The following discussion is a description of one system which can be utilized to produce the ion beams for surface treatment of various materials. This system has two major subsystems, the pulsed power source and the MAP ion diode.

The MAP ion diode which forms the present invention, when combined with the RHEPP source, provides for an ion beam generator system capable of high average power and repetitive operation over an extended number of operating cycles for treating large surface areas of materials at commercially attractive costs. In particular, the ion beam generator of the present invention can produce high average power (1 kW–4 MW) pulsed ion beams at 0.1–2.5 MeV energies and pulse durations or lengths of from about 10 nanoseconds (ns)–2 microseconds ($\mu$s) or longer as necessary for the particular application. The ion beam generator can directly deposit energy in the top 50 micrometers ($\mu$m) of the surface of a material. The depth of treatment can be controlled by varying the ion energy and species as well as the pulse length. The MAP ion diode can be combined with other power sources where less demanding power demands are present.

The first of the components in the pulsed ion beam generating system is a compact, electrically efficient, repetitively pulsed, magnetically switched, pulsed power system capable of $10^9$ pulse operating cycles of the type described by H. C. Harjes, et al, Pro 8th IEEE Int. Pulsed Power Conference (1991), and D. L. Johnson et al., "Results of Initial Testing of the Four Stage RHEPP Accelerator" pp. 437–440 and C. Harjes et al., "Characterization of the RHEPP 1 $\mu$s Magnetic Pulse Compression Module", pp. 787–790, both reprinted in the Digest of Technical Papers of the Ninth IEEE International Pulsed Power Conference, June, 1993, all of which is incorporated by reference herein. These references in conjunction with the discussion herein below place fabrication of such a pulsed power source within the skill of the art.

Figure 1:
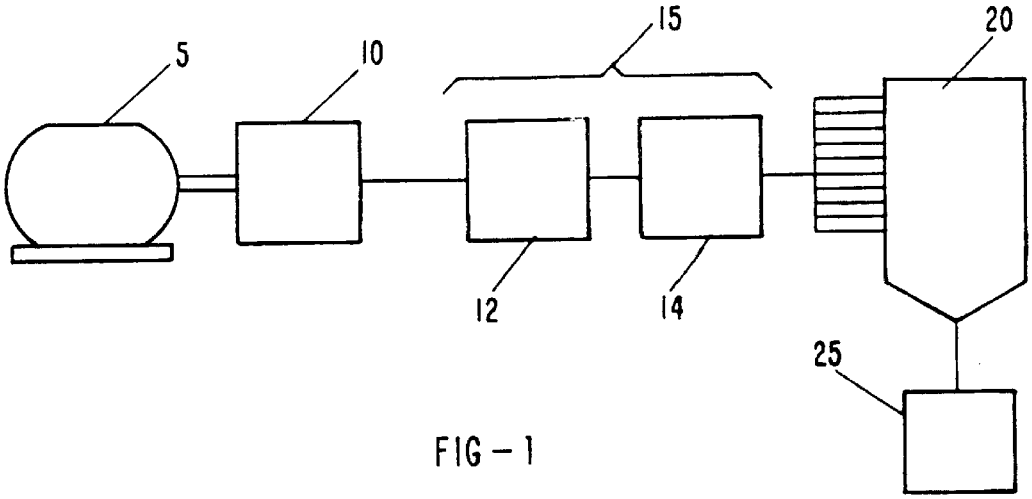
FIG. 1 is a schematic of the RHEPP pulsed power system.

A block diagram of a power system produced according to the teachings of the present application is shown in FIG. 1. From the prime power input, several stages of magnetic pulse compression and voltage addition are used to deliver a pulsed power signal of up to 2.5 MV, 60 ns FWHM, 2.9 kJ pulses at a rate of 120 Hz to an ion beam source for this particular system. The power system converts AC power from the local power grid into a form that can be used by an ion beam source 25.

Referring to FIG. 1, in one embodiment of the invention, the power system comprises a motor 5 which drives an alternator 10. The alternator 10 delivers a signal to a pulse compression system 15 which has two subsystems, a 1 $\mu$s pulse compressor 12 and a pulse forming line 14. The pulse compression system 15 provides pulses to a linear inductive voltage adder (LIVA) 20 which delivers the pulses to the ion beam source 25.

The alternator 10 according to one embodiment is a 600 kW, 120 Hz alternator. In the unipolar mode, it provides 210 A rms at a voltage of 3200 V rms with a power factor of 0.88 to the magnetic switch pulse compressor system 15. The alternator is driven by a motor connected to the local 480V power grid. The particular alternator used herein was designed by Westinghouse Corporation and fabricated at the Sandia National Laboratories in Albuquerque, N.M. It is described in detail in a paper by R. M. Calfo et al., "Design and Test of a Continuous Duty Pulsed AC Generator" in the Proceedings of the 8th IEEE Pulsed Power Conference, pp. 715–718, June, 1991, San Diego, Calif. This reference is incorporated herein in its entirety. This particular power system was selected and built because of its relative ease in adaptability to a variety of loads. Other power sources may be used and may indeed be better optimized to this particular use. For example, a power supply of the type available for Magna-Amp, Inc. comprising a series of step-up transformers connected to the local power grid feeding through a suitably-sized rectifier could be used. The present system however has been built and performs reasonably well.

In one embodiment, the pulse compression system 15 is separated into two subsystems, one of which is a common magnetic pulse compressor 12 composed of a plurality of stages of magnetic switches (i.e., saturable reactors) the operation of which is well known to those skilled in the art. This subsystem is shown in more detail in FIG. 1A. The basic operation of each of the stages is to compress the time width (transfer time) of and to increase the amplitude of the voltage pulse received from the preceeding stage. Since these are very low loss switches, relatively little of the power is wasted as heat, and the energy in each pulse decreases relatively little as it moves from stage to stage. The specific subsystem used herein is described in detail by H. C. Harjes, et al., "Characterization of the RHEPP 1 μs Magnetic Pulse Compression Module", 9th IEEE International Pulsed Power Conference, pp. 787–790, Albuquerque, N.M., June, 1993. This paper is incorporated by reference herein in its entirety. These stages as developed for this system are quite large. In the interest of conserving space, it would be possible to replace the first few stages with appropriately designed silicon control rectifiers (SCR's) to accomplish the same pulse compression result.

These stages 12 convert the output of the alternator 10 into a 1 μs wide LC charge waveform which is then delivered to a second subsystem 14 comprising a pulse forming line (PFL) element set up in a voltage doubling Blumlein configuration. The PFL is a triaxial water insulated line that converts the input LC charge waveform to a flat-top trapezoidal pulse with a design 15 ns rise/fall time and a 60 ns FWHM. The construction and operation of this element is described in detail by D. L. Johnson et al. "Results of Initial Testing of the Four Stage RHEPP Accelerator", 9th IEEE International Pulsed Power Conference, pp. 437–440, Albuquerque, N.M., June, 1993. This paper is also incorporated by reference in its entirety. A cross sectional view of the PFL is shown in FIG. 1B.

Figure 1A:
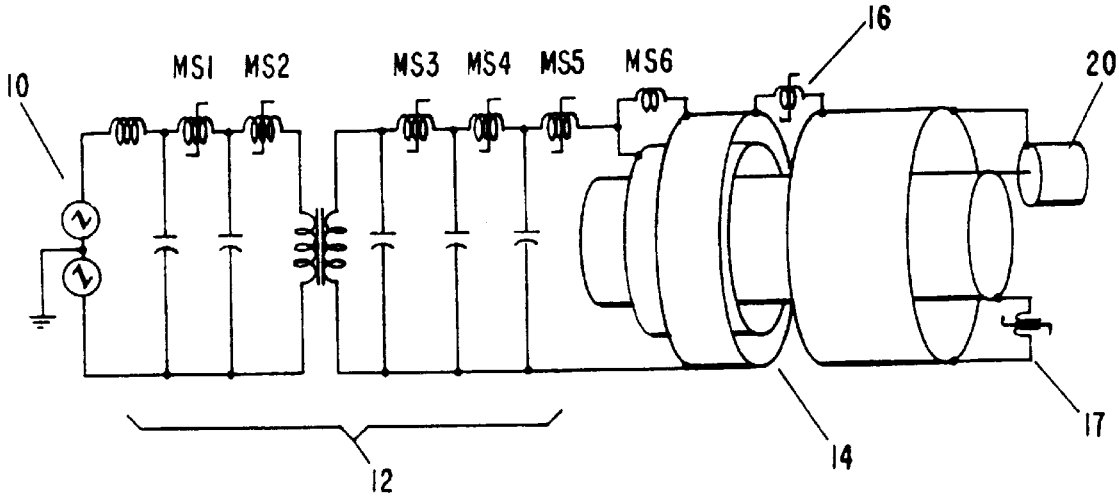
FIG. 1A is a circuit diagram of a pulse compression system 15 utilized in the pulsed power system of FIG. 1.

The pulse compression system 15 can provide unipolar, 250 kV, 15 ns rise time, 60 ns full width half maximum (FWHM), 4 kJ pulses, at a rate of 120 Hz, to the linear inductive voltage adder (LIVA) (20). In a preferred embodiment, the pulse compression system 15 should desirably have an efficiency >80% and be composed of high reliability components with very long lifetimes ($\sim 10^9$–$10^{10}$ pulses). Magnetic switches are preferably used in all of the pulse compression stages, MS1–MS5, because they can handle very high peak powers (i.e., high voltages and currents), and because they are basically solid state devices with a long service life. The five compression stages used in this embodiment as well as the PFL 14 are shown in FIG. 1A. The power is supplied to the pulse compression system 15 from the alternator 10 and is passed through the magnetic switches, MS1–MS5, to the PFL 14. The PFL is connected to the linear induction voltage adder (LIVA) 20 described below. The second and third magnetic switches, MS2 and MS3, are separated by a step-up transformer T1 as shown. Switch MS6 is an inversion switch for the PFL.

Figure 1B:
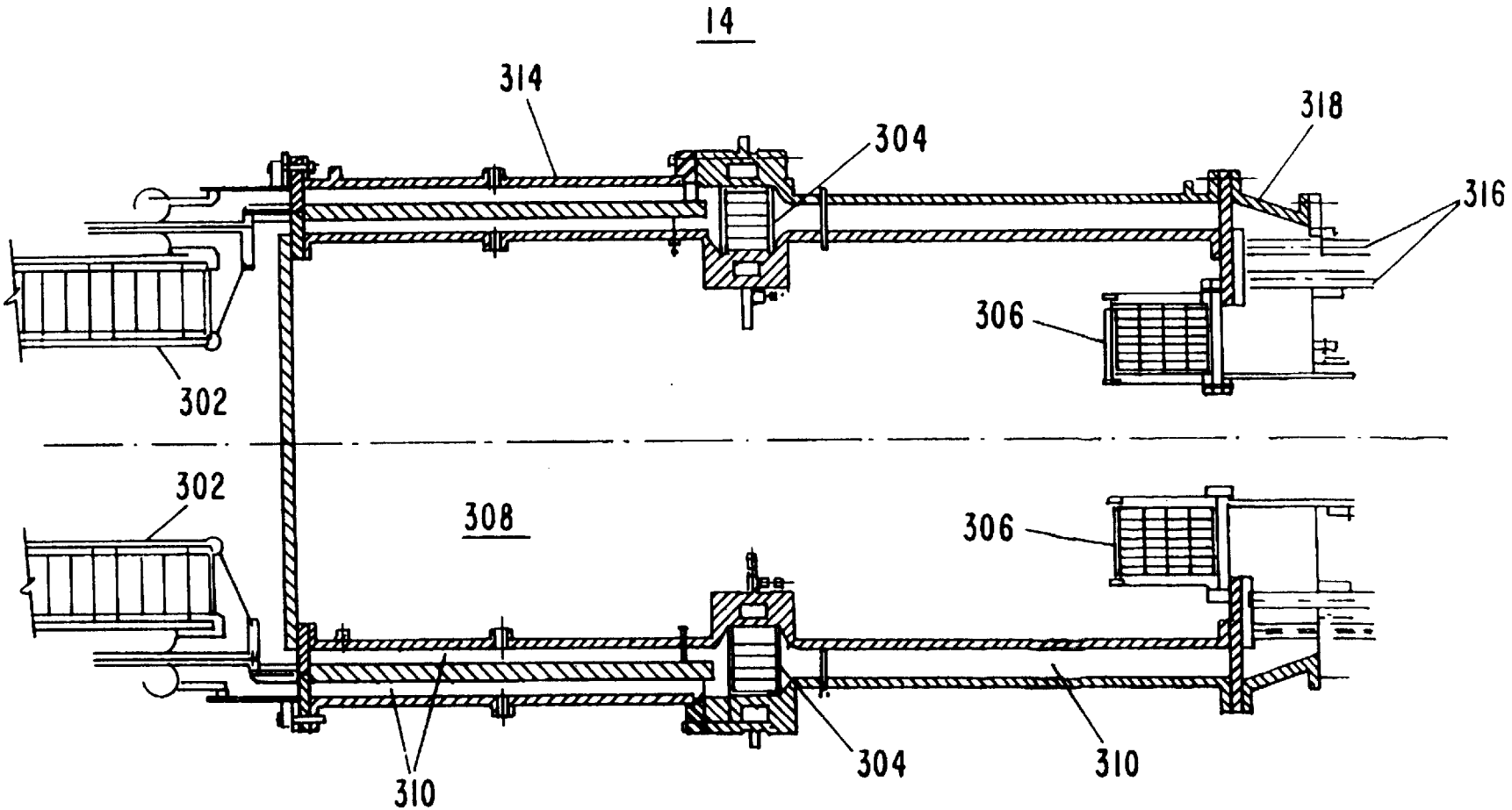
FIG. 1B is a cross sectional view of a pulse forming line element.

The pulse forming line (PFL) element 14 is shown in schematically in FIG. 1A and in cross section in FIG. 1B. MS6 in FIG. 1A corresponds to the inversion switch 302 shown in FIG. 1B located on the input side of the tri-axial section 314 of the PFL. Output switches 304 and charging cores 306 are also shown. The regions 310 are filled with deionized water as the dielectric. The interior region 308 is filled with air and oil cooling lines, not shown, for the output switches 304. The output of the PFL is fed in parallel to each of the individual LIVA stages 20, with the positive component flowing through conductors 316 and the shell 318 of the PFL serving as ground. The positive conductors 316 are connected to each of the LIVA stages.

Figure 1C:
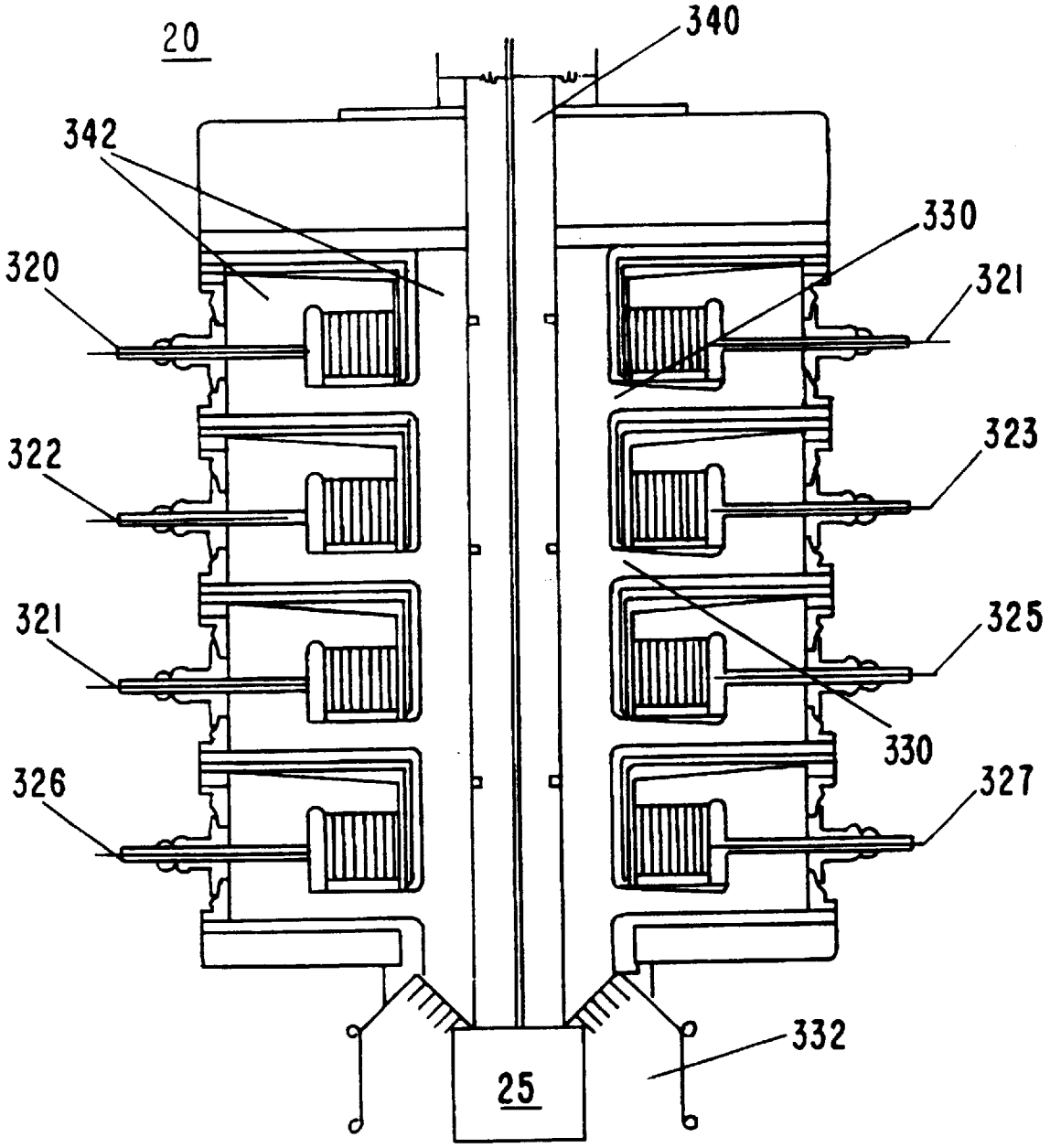
FIG. 1C is a cross sectional view of the Linear Inductive Voltage Adder (LIVA)

The LIVA (20) is preferably liquid dielectric insulated. It is connected to the output of the PFL and can be configured in different numbers of stages to achieve the desired voltage for delivery to the ion beam source. The LIVA 20 can deliver nominal 2.5 MV, 2.9 kJ, pulses at a rate of 120 Hz to the ion beam source 25 when configured with 10 stages of 250 kV each. For most of the ion beam treatments, the LIVA was configured with four stages of 250 kV each, such that the LIVA delivered a total of 1.0 MV to the ion beam source. However, this voltage can be increased or decreased by changing the number of stages in the LIVA to match the particular material processing need. The nominal output pulse of the LIVA 20 is the same as that provided to it by the PFL, namely, trapezoidal with 15 ns rise and fall times and 60 ns FWHM (full width half maximum). FIG. 1C shows a cross section of the four stage LIVA. The four stages, 320, 322, 324, and 326, are stacked as shown and fed the positive pulses from the PFL via the cables 321,323,325, and 327. The stages are separated by gaps 330 and surrounded by transformer oil for cooling. The output from each of the LIVA stages adds to deliver a single total pulse to the ion beam source shown here schematically as 25 which is located within a vacuum chamber 332, shown in partial view. As with the PFL, the outside shell of the LIVA is connected to ground.

The power system P (FIG. 1) as described, can operate continuously at a pulse repetition rate of 120 Hz delivering up to 2.5 kJ of energy per pulse in 60 ns pulses. The specific power system described here can deliver pulsed power signals of about 20–1000 ns duration with ion beam energies of 0.25–2.5 MeV. The power system can operate at 50% electrical efficiency from the wall plug to energy delivered to a matched load. The power system P uses low loss pulse compression stages incorporating, for example, low loss magnetic material and solid state components, to convert AC power to short, high voltage pulses.

The ability to produce voltages from 250 kV to several MV by stacking voltage using a plurality of inductive adders incorporating low loss magnetic material is a principle feature when high voltages are needed, although it is also possible to use a single stage pulse supply, eliminating the need for the adder.

The power system can operate at relatively low impedances (<100Ω) which also sets it apart from many other repetitive, power supply technologies, such as transformer-based systems. This feature allows high treatment rates and the treatment of large areas (5 to more than 1000 $cm^2$) with a single pulse so as to reduce edge effects occurring at the transition between treated and untreated areas.

Figure 2:
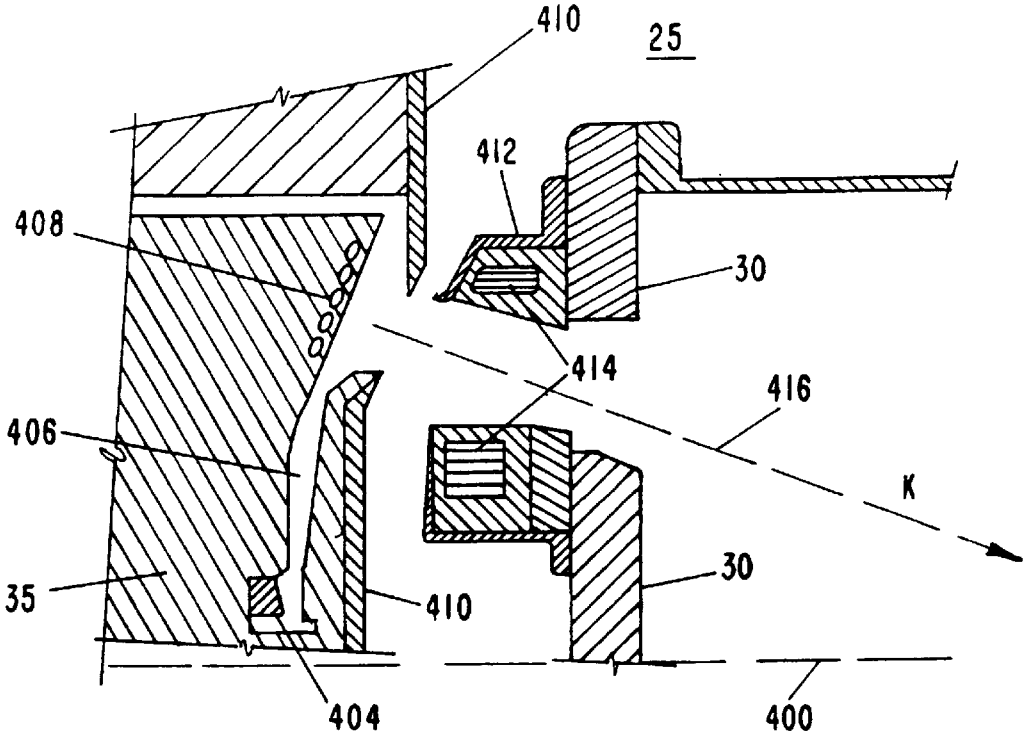
FIG. 2 is a partial cross sectional view of the magnetically-confined anode plasma (MAP) source 25 of the present invention.

The second component of the pulsed ion beam system is the MAP ion beam source 25, the invention herein (shown in FIG. 2). The MAP ion beam source is capable of operating repetitively and efficiently to utilize the pulsed power signal from the power system efficiently to turn gas phase molecules into a high energy pulsed ion beam. It can also be operated in the single shot mode, as necessary for a particular application. A precursor of the ion beam source is an ion diode described generally by J. B. Greenly et al, "Plasma Anode Ion Diode Research at Cornell: Repetitive Pulse and 0.1 TW Single Pulse Experiments", Proceedings of 8th Intl. Conf. on High Power Particle Beams (1990) all of which is incorporated by reference herein. Although this reference ion diode differs significantly from the ion diode utilized in the present system as discussed above, the background discussion in this reference is of interest.

Figure 2A:
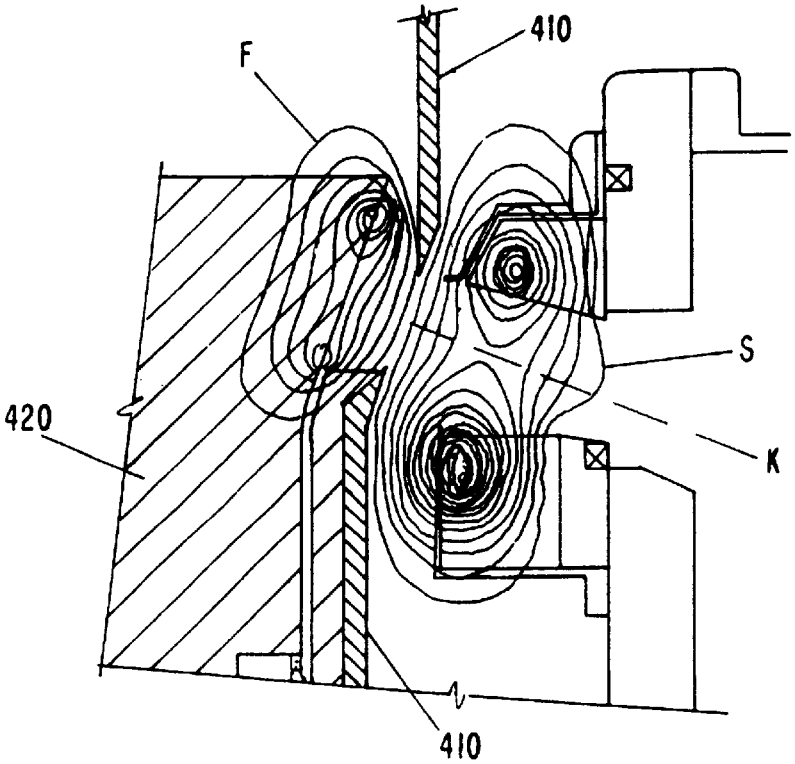
FIG. 2A is a modified version of FIG. 2 showing the magnetic field lines produced by the fast and slow coils in the MAP source.

The ion beam source 25, according to the principles of the present invention, is shown in FIG. 2. The ion beam source 25 is a magnetically-confined anode plasma (MAP) source. FIG. 2 is a partial cross-sectional view of one symmetric side of the ion beam or MAP source 25. The ion beam or MAP source 25 produces an annular ion beam K which can be brought to a broad focus symmetric about the axis X—X 400 shown. In the cathode electrode assembly 30 slow (1 ms rise time) magnetic field coils 414 produce magnetic flux S (as shown in FIG. 2A) which provides the magnetic insulation of the accelerating gap between the cathodes 412 and the anodes 410. The anode electrodes 410 also act as magnetic flux shapers. The slow coils 414 are cooled by adjacent water lines, not shown, incorporated into the structure 30 supporting the cathodes 412 and the slow coils 414. The main portion of the MAP structure shown in this Figure is about 18 cm high and wide. The complete MAP ion diode can be visualized as the revolution of the cross-sectional detail of FIG. 2 about the central axis 400 of the device to form a cylindrical apparatus. A full cross sectional view appears in FIG. 3.

The ion beam or MAP source 25 operates in the following fashion: a fast gas valve assembly 404 located in the anode assembly 35 produces a rapid (200 $\mu$s) gas puff which is delivered through a supersonic nozzle 406 to produce a highly localized volume of gas directly in front of the surface of a fast driving coil 408 located in an insulating structure 420. The nozzle is designed to prevent any transverse flow of non-ionized gas into the gap between the anodes 410 and cathodes 412. After pre-ionizing the gas with a 1 $\mu$s induced electric field, the fast driving coil 408 is fully energized from the fast capacitor 150, inducing a loop voltage of 20 kV on the gas volume, driving a breakdown to full ionization, and moving the resulting plasma toward the anode electrodes 410 in about 1.5 $\mu$s or less, to form a thin magnetically-confined plasma layer. The plasma momentarily stagnates at the separatrix, next to the insulating field S produced by the slow coils 414, awaiting the delivery of the main accelerating positive electrical pulse to be delivered at the anodes 410 from the LIVA discussed above.

The pre-ionization step is a departure from the earlier MAP reference which showed a separate conductor located on the face of a surface corresponding to the insulating structure 420 herein. Since this conductor was exposed to the plasma, it broke down frequently. The inventor herein discovered that the separate pre-ionizing structure was unnecessary. The gas can be effectively pre-ionized by placing a small ringing capacitor 160 in parallel with the fast coil. The field oscillations produced by this ringing circuit pre-ionize the gas in front of the anode fast coil. A schematic electrical diagram of this circuit is shown in FIG. 2C.

I have also discovered that, prior to provision of the main pulse to the fast coil, it is beneficial to have the ability to adjust the configuration of the magnetic field in the gap between the fast coil and the anode to adjust the initial position of plasma formation in the puffed gas pulse prior to the pre-ionization step. This is accomplished by the provision of a slow bias capacitor 180 and a protection circuit both being installed in parallel with the fast coil and isolated therefrom by a controllable switch S2. A slow bias field is thus created prior to pre-ionization of the gas by the fast coil. This circuit is also shown in FIG. 2C.

Figure 2B:
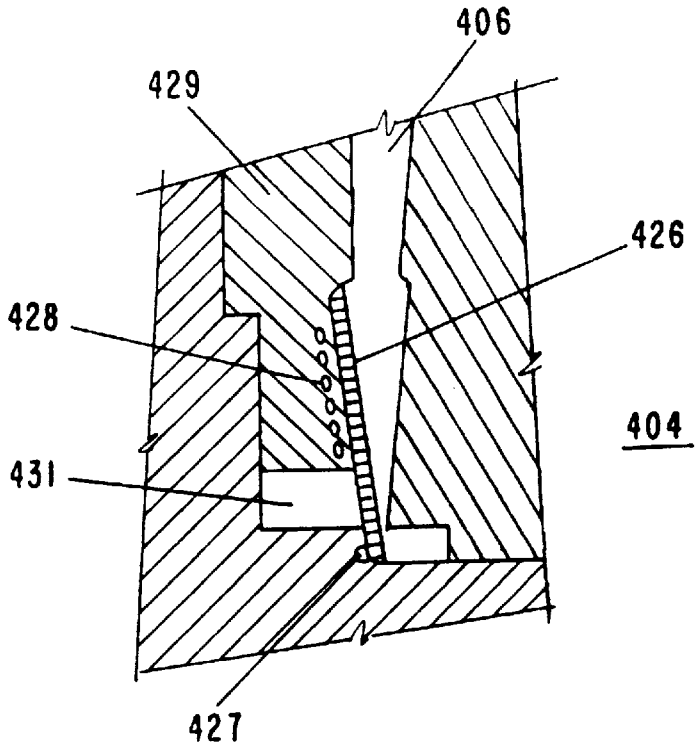
FIG. 2B is an expanded view of a portion of FIG. 2 showing the gas inlet valve and the gas inlet channel.
Figure 2C:
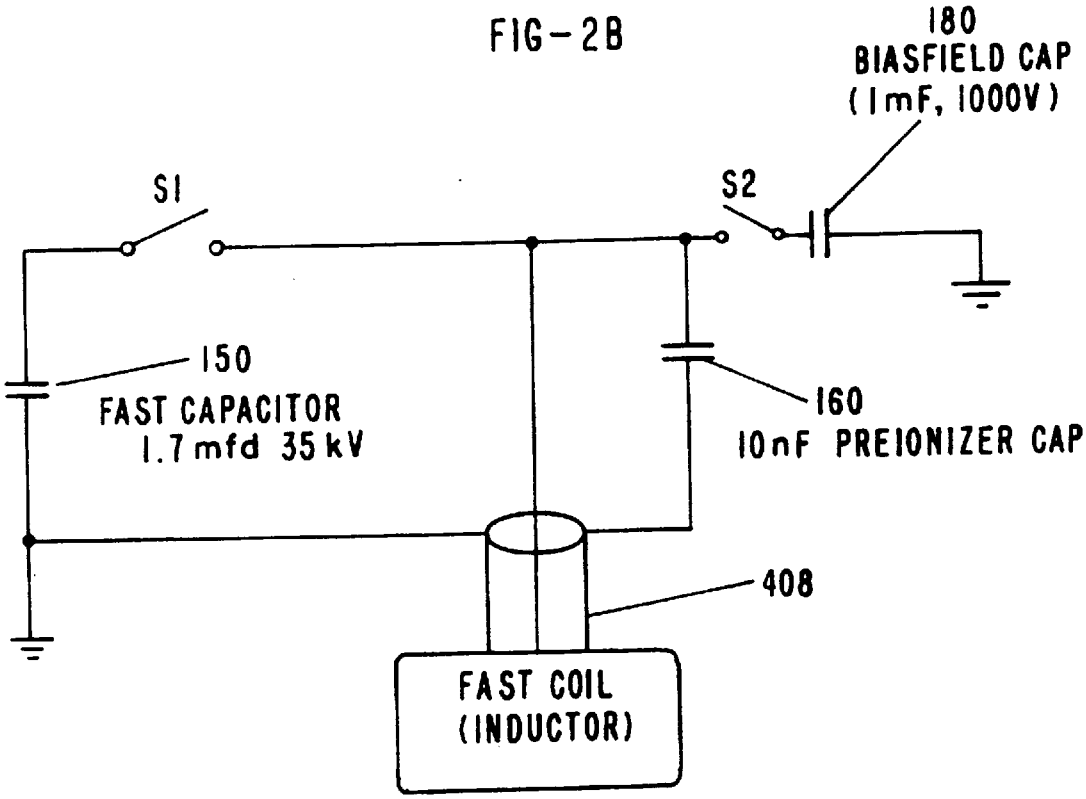
FIG. 2C is a schematic diagram of the electric circuit for the fast coil.

In further explanation of the electrical circuit for the fast coil as shown in FIG. 2C, the bias field capacitor 180 drives a greater than 1 microsecond risetime current in the fast coil before the main capacitor pulse begins. This allows adjustment of the field configuration produced by the fast capacitor current. The fast capacitor 150 drives a 1 microsecond risetime pulse in the fast coil. The preionizer capacitor 160 causes the voltage across the fast coil to ring with a much less than 1 microsecond period, inducing a large oscillating electric field in the gas to be ionized, leading to partial ionization of the gas. The rising magnetic field produced by the fast coil 408 pushes the ionized gas away from the fast coil, stagnating it against the preexisting magnetic field from the slow coil 414.

After pre-ionization the fast coil is then fully energized as described above to completely breakdown the gas into the plasma. After this pulse the field collapses back into the fast coil which is connected to a resistive load which is in turn connected to a heat sink, not shown. In the present embodiment, cooling channels in the supporting structure are used, but other solutions are possible and relatively straightforward. In this manner heat build up in the fast coil is avoided.

The fast coils 408 have been redesigned from the reference fast coils in several ways as well as the heat sinking mentioned above. The gap between the fast coil and the anode electrodes 410 has been reduced with the result that the amount of necessary magnetic energy has been decreased by over 50%. The lower energy requirement permits repetitive use at higher frequencies and reduces the complexity of the feed system voltages for the fast coils. The design of the new flux-shaping anode electrode assembly has also contributed to these beneficial results.

The pulsed power signal from the power system is then applied to the anode assembly 35, accelerating ions from the plasma to form an ion beam K. The slow (S) and fast (F) magnetic flux structures, at the time of ion beam extraction, are shown in FIG. 2A. The definite separation between the flux from the fast coil from the flux from the slow coil is shown therein. This is accomplished by the flux-shaping effects of the anodes 410 and also by the absence of a slow coil located in the insulating structure 420 as was taught in the earlier MAP reference paper. The slow coils in the present MAP ion diode are located only in the cathode area of the MAP. This anode flux shaping in conjunction with the location of slow coils in the cathode assembly is different from that shown in the MAP reference paper and permits the high repetition rate, sustained operation of the MAP diode disclosed herein. This design allows the separatrix to be positioned near the anode surface, resulting in an extracted ion beam with minimal or no rotation. This minimal rotation is necessary for effective delivery of the beam to the material to be treated.

Figure 3:
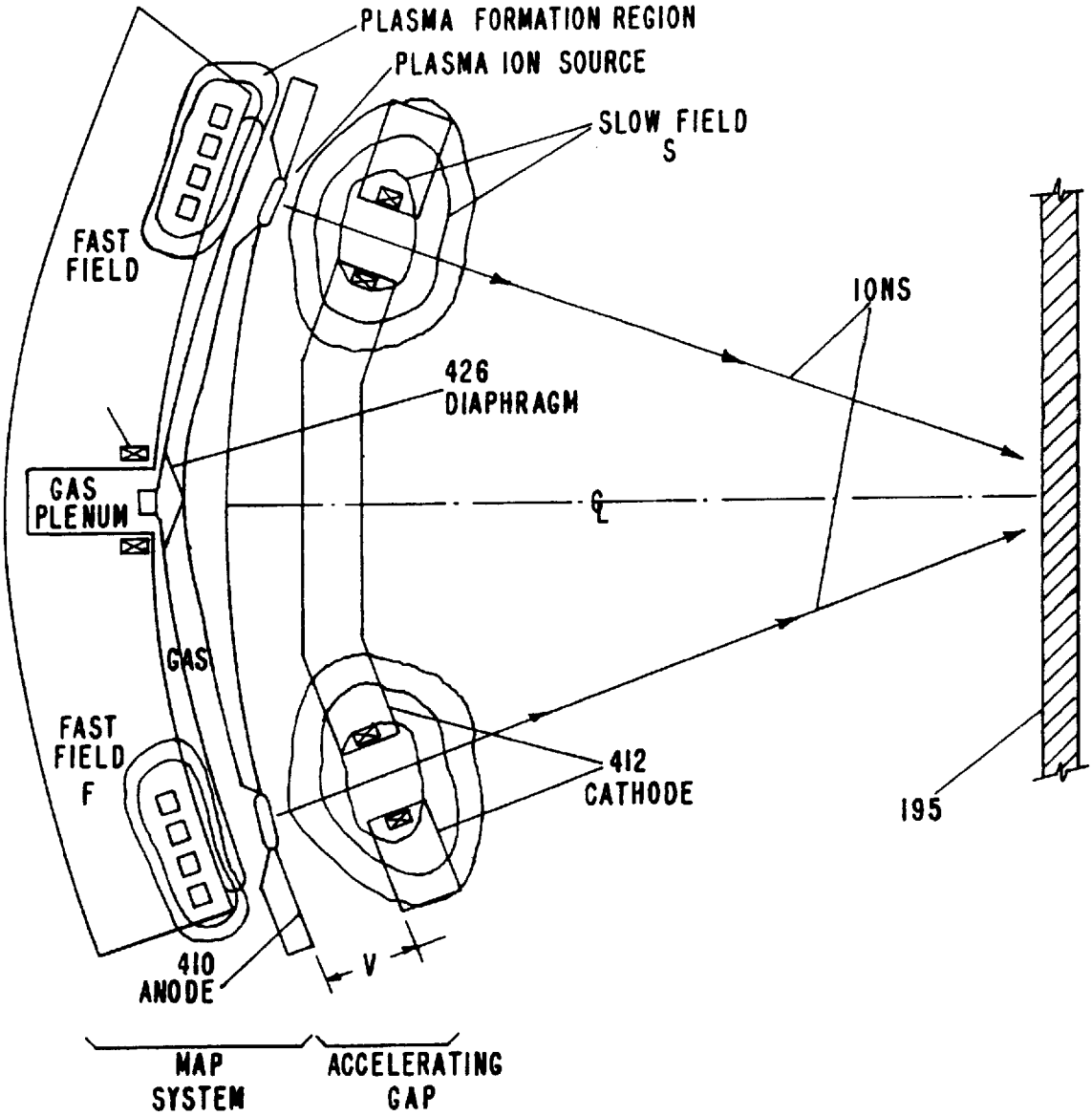
FIG. 3 is a schematic full cross-sectional view of the MAP ion diode.

FIG. 2B is a detailed view of the gas valve assembly 404 and the passage 406 which conducts the gas from the valve 404 to the area in front of the fast coil 408. The passage 406 has been carefully designed to deposit the gas in the localized area of the fast coil with a minimum of blow-by past this region. The details of the cross sections of the passage 406 were designed for supersonic transport of the gas puff The design was done with readily available gas flow computer programs and is within the skill in the art. The gas valve flapper 426 is operated by a small magnetic coil 428 which opens and closes the flapper 426 upon actuation from the MAP control system. The flapper valve is pivoted on the bottom end 427 of the flapper. The coil 428 is mounted in a high thermal conductivity ceramic support structure 429 which is in turn heat sinked to other structure, not shown. Alternatively, externally cooled wires surrounding the coil could also serve to extract the heat from the coils. This heat sinking is necessary for the sustained operating capability of the MAP. The gas is delivered to the valve from a plenum 431 behind the base of the flapper. The plenum 431 should be visualized as being connected to a larger plenum located at the central core of the complete MAP ion diode as shown in FIG. 3.

The vacuum in the nozzle 406 rapidly draws the gas into the MAP once the flapper 426 is opened. The function of the nozzle is to produce a directed flow of gas only in the direction of the nozzle and not transverse to it. Such transverse flow would direct gas into the gap between the anode and the cathode which would produce detrimental arcing and other effects. The reduction of the fast coil-anode gap discussed above makes the design of the nozzle very important to the successful operation of the MAP. Fortunately, gas flow design tools are available and were used to develop a nozzle with improved gas flow (higher mach number) and minimal boundary effects. This improved nozzle has an enlarged opening into the gap between the fast coil and the near edge of the anode which tapers from 9 to 15 mm instead of the straight walled 6 mm conduit in the reference MAP. The operating pressure of the gas in the puff valve has been increased from the range of 5–25 psig to the range of 25–40 psig. Experiments have confirmed much improved MAP operation as a result of this new design.

The ion diode of this invention is distinguished from prior art ion diodes in several ways. Due to its low gas load per pulse, the vacuum recovery within the MAP allows sustained operation up to and above 100 Hz. As discussed above, the magnetic geometry is fundamentally different from previous MAP diodes. Prior diodes produced rotating beams that were intended for applications in which the ion beam propogates in a strong axial magnetic field after being generated in the diode. The present system requires that the ion beam be extracted from the diode to propogate in field-free space a minimum distance of 20–30 cm to a material surface. The magnetic configurations of previous MAP diodes are incapable of this type of operation because those ion beams were forced by the geometries of those diodes to cross net magnetic flux and thus rotate. Such beams would rapidly disperse and be useless for the present purposes. By moving the slow coils (the diode insulating magnetic field coils) to the cathode side of the diode gap eliminated the magnetic field crossing for the beam but required a total redesign of the magnetic system for the anode plasma source.

The modifications to the fast coil discussed above result in an energy requirement that is 5–10 times less than previous configurations. The modifications include: the elimination of a slow coil on the anode side of the diode and its associated feeds, better control over the magnetic field shaping and contact of the anode plasma to the anode electrode structure through use of the partially field-penetrable electrodes, the elimination of the separate pre-ionizer coil from the prior ion diodes, the circuit associated with the fast coil to provide "bias" current to adjust the magnetic field to place the anode plasma surface on the correct flux surface to eliminate beam rotation and allow optimal propagation and focusing of the beam, and the redesign of the gas nozzle to better localize the gas puff which enables the fast coil to be located close to the diode gap which in turn reduces the energy requirements and complexity of the fast coil driver.

The plasma can be formed using a variety of gas phase molecules. The system can use any gas (including hydrogen, helium, oxygen, nitrogen fluorine, neon, chlorine and argon) or vaporizable liquid or metal (including lithium, beryllium, boron, carbon, sodium, magnesium, aluminum, silicon, phosphorous, sulfur, and potassium ) to produce a pure source of ions without consuming or damaging any component other than the gas supplied to the source. The ion beam K propagates 20–30 cm in vacuum (~$10^3$) to a broad focal area (up to 1000 $cm^2$) at the target plane 195, shown in FIG. 3, where material samples are placed for treatment and can thermally alter areas from 5 $cm^2$ to over 1000 $cm^2$.

The ion beam or MAP source 25 is capable of operating at repetitive pulse rates of 100 Hz continuously with long component lifetimes >$10^6$. The ion beam or MAP source 25, according to the principles of the present invention, draws ions from a plasma anode rather than a solid dielectric surface flashover anode used in present single pulse ion beam sources. Use of a flashover anode typically introduces a variety of contaminants to the surface of the material, often with detrimental results. One of the significant advantages of the using the improved MAP source disclosed herein is that one has precise control over the components in the ion beam by controlling the composition of the gas source.

I claim:

1. A pulsed ion beam source comprising:

means for delivering a gas puff to a first gap between fast magnetic field means for forming a fast magnetic field and anode electrode means, the fast magnetic field fully ionizing the gas puff to produce a plasma and moving the resulting plasma into an accelerating gap between the anode electrode means and cathode electrode means;

means for forming a magnetically insulated accelerating gap for passing the plasma comprising means for forming a slow magnetic field, said slow magnetic field means being located proximate to the cathode electrode means;

wherein the fast and slow magnetic fields intersect to define a separatrix region where the plasma is on a flux surface that eliminates beam rotation and means for delivering a positive electric charge pulse from a power source to the anode electrode means for the purpose of accelerating ions in the plasma from the separatrix region towards a target.

2. The ion beam source of claim 1 wherein the anode electrode means and the cathode electrode means are ring-shaped structures disposed about a central axis of the ion beam source with each such structure having an annulus through which the plasma passes.

3. The ion beam source of claim 2 wherein said means for delivering a gas puff allows supersonic flow rates within it and causes localized delivery of the gas puff into the first gap but without entry of the gas puff in an nonionized state into the annulus of the anode electrode means.

4. The ion beam source of claim 2 wherein the structure of the anode electrode means is optimized to locate the separatrix within the anode electrode annulus.

5. The ion beam source of claim 1 wherein the fast magnetic field means further includes means for positioning the plasma within the first gap.

6. The ion beam source of claim 1 further comprising means for preionizing the gas puff.

7. The ion beam source of claim 4 [wherein the] *further comprising a* means for preionizing the gas puff [comprises] *comprising said fast magnetic field means and* a capacitor which [forms] *form* a [tinging] *ringing* circuit [with the fast magnetic field means with] *having* a period of less than one microsecond.

8. The ion beam source of claim 1 wherein the fast magnetic field means and the slow magnetic field means comprise, respectively, fast and slow magnetic coils.

9. The ion beam source of claim 8 further comprising bias field means including a bias field capacitor connected to the fast magnetic coil to produce a greater than one microsecond risetime current in the fast magnetic coil prior to [full] *pre*-ionization of the gas [puffy], *puff* said bias field [optimizing] *positioning* the [position of the] *gas for pre*-ionization of the gas [puff] into [the] *a partially ionized* plasma.

10. The ion beam source of claim 8 [wherein none of] *where essentially no magnetic flux from* the slow magnetic field means are located on the side of the first gap proximate to the fast magnetic coil field means.

*11. A magnetically confined anode plasma source for generating an ion beam having little or no rotation, said plasma source comprising:*

*a cathode assembly having a cathode electrode and an associated slow magnetic coil field for generating a magnetic flux having a first profile;*

*an anode assembly having an anode electrode and an associated fast magnetic field coil for generating a magnetic flux having a second profile, said first and second magnetic flux profiles having a separatrix when said slow and fast magnetic field coils are energized;*

*wherein said cathode electrode and anode electrode form therebetween an ion acceleration gap and wherein the separatrix between said first magnetic flux profile and said second magnetic flux profile is disposed in said acceleration gap adjacent to said anode electrode.*

*12. The plasma source according to claim 11, wherein said slow magnetic field coil has a rise time of about 1 ms.*

*13. The plasma source according to claim 11, wherein the magnetic flux of said slow magnetic field coil provides magnetic insulation for the ion acceleration gap everywhere.*

*14. The plasma source according to claim 11, wherein said first magnetic coil has a rise time of less than about 1 μs.*

*15. A magnetically confined anode plasma source for generating an ion beam comprising:*

*an anode assembly including an anode electrode having an associated fast driving coil;*

*a cathode assembly including a cathode electrode and an associated slow driving coil, said anode electrode and cathode electrode forming therebetween an ion acceleration gap;*

*a gas valve assembly associated with said anode assembly, said gas valve assembly including a supersonic gas delivery nozzle for delivering a localized volume of gas to a region adjacent to said fast driving coil, said gas volume, as delivered to said region, being essentially free of flow components transverse to said acceleration gap.*

*16. The plasma source according to claim 15, wherein said supersonic nozzle directs said gas volume only in the axial direction of said nozzle and deposits essentially all of said gas volume in the region adjacent to said fast coil.*

*17. The plasma source according to claim 16, wherein said anode electrode has an edge portion and said supersonic nozzle includes an enlarged opening which opens into the region adjacent said fast coil and proximate to the edge portion of said anode.*

*18. The plasma source according to claim 16, wherein said gas valve assembly includes gas plenum and a flapper valve for controlling introduction of the gas from said supply plenum to said supersonic nozzle.*

*19. The plasma source according to claim 18, wherein said flapper valve is magnetically actuated.*

*20. A magnetically confined anode plasma source for generating an ion beam comprising:*

*an anode assembly including an anode electrode and an associated fast driving coil;*

*a cathode assembly including a cathode electrode and an associated slow driving coil, said anode electrode and cathode electrode defining therebetween an ion acceleration gap;*

*a gas valve assembly for introducing a volume of gas into a region adjacent said fast driving coil upstream of said acceleration gap;*

*a fast coil energizing circuit including a voltage source, switchably connected to said fast driving coil, for ionizing the gas to form a plasma and for adjusting the magnetic field between the fast driving coil and the anode electrode to thereby position the volume of plasma with respect to the accelerating gap.*

*21. The plasma source according to claim 20, wherein said fast coil energization circuit further comprises a second voltage source connected in parallel with said fast coil for forming, when together with said fast driving coil, a ringing circuit for pre-ionizing the gas positioned between the fast driving coil and the anode electrode.*

*22. The plasma source according to claim 21, wherein said ringing circuit has an oscillation period of less than about 1 μs.*

*23. The plasma source according to claim 21, wherein said fast coil energizing circuit is switchably connected to said fast driving coil for directing the pre-ionized gas away from said fast driving coil, and a power source for energizing said slow driving coil whereby the resulting magnetic field provides a stagnation zone for said pre-ionized gas.*

*24. The plasma source according to claim 20, wherein said voltage source comprises a current supply connected in parallel with said fast driving coil to adjust the magnetic field to improve plasma formation and positioning.*

*25. The plasma source according to claim 24, wherein said current supply comprises a bias capacitor.*

*26. A pulsed magnetically confined anode plasma source for surface treatment comprising:*

*an anode assembly including an anode electrode and an associated fast driving magnetic coil;*

*a cathode assembly including a cathode electrode and an associated slow driving magnetic coil, said anode electrode and cathode electrode forming therebetween a diode having an ion acceleration gap, said slow driving magnetic coil forming a diode insulating magnetic field in said plasma acceleration gap;*

*a gas valve assembly for introducing a volume of gas into a region adjacent said fast driving coil;*

*an inductively produced electric field producing source for ionizing said gas into a plasma; and*

*a pulsed power source connected to said anode assembly for accelerating ions from said plasma to form an extractable ion beam, said anode electrode being configured to shape the magnetic flux from the fast driving and slow driving coils whereby said ion beam is extracted with little or no rotation.*

*27. The plasma source according to claim 26, wherein said anode electrode is configured to provide a separatrix between the magnetic fluxes from said slow during coil and fast driving coil at the time of beam extraction.*

*28. The plasma source according to claim 27, wherein said separatrix is positioned adjacent to said anode electrode in said plasma acceleration gap.*

*29. The plasma source according to claim 27, further comprising an essentially magnetic field free region downstream from said cathode assembly in the direction of ion beam propagation, through which said extracted ion beam propagates.*

*30. The plasma source according to claim 29, wherein said essentially magnetic field free region terminates at a surface of a workpiece to be treated and extends at least 20 cm in the direction of beam propagation.*

*31. The plasma source according to claim 26, wherein said slow driving coil is disposed essentially exclusively in said cathode assembly.*

*32. The plasma source according to claim 26, wherein said plasma source is maintained at a vacuum of about $10^{-3}$ torr.*

*33. The plasma source according to claim 26, wherein said extracted ions are drawn essentially exclusively from said plasma and said pulsed power source is operable to run continuously at a pulse rate of up to about 120 Hz.*

*34. The plasma source according to claim 26, wherein said gas valve assembly includes a selectable source of gas whereby the composition of the ions in the extracted ion beam are controllable.*

*35. The plasma source according to claim 34, wherein said gas source is selected from the group comprising hydrogen, helium, oxygen, nitrogen, fluorine, neon, chlorine, argon, lithium, beryllium, boron, carbon, sodium, magnesium, aluminum, silicon, phosphorous, sulfur and potassium.*

*36. A method of generating an ion beam using a magnetically confined anode plasma ion source comprising a vacuum chamber having an anode assembly including an anode electrode and a fast driving coil and a cathode assembly including a cathode electrode and a slow driving coil, the anode electrode and cathode electrode defining therebetween an acceleration gap, said method comprising the steps of:*

*(a) introducing a puff of gas into said vacuum chamber to produce a localized volume of gas adjacent said fast driving coil but insulated from said fast driving coil;*

*(b) pre-ionizing said gas using said fast driving coil;*

*(c) further ionizing said gas while moving said gas away from said fast driving coil to create a thin, magnetically confined plasma layer;*

*(d) applying a pulsed power signal to said anode electrode to form an ion beam from said plasma; and*

*(e) extracting said ion beam essentially without rotation thereof.*

*37. The method according to claim 36, wherein the step of introducing a gas puff further comprises rapidly introducing said gas puff in a time interval depart of the gas used.*

*38. The method according to claim 36, wherein the step of introducing a gas puff further comprises delivering said gas puff supersonically.*

*39. The method according to claim 38, wherein the step of introducing a gas puff comprises expanding said gas puff into said vacuum chamber through a supersonic nozzle.*

*40. The method according to claim 36, further comprising directing essentially the entire gas puff to the region adjacent said fast driving coil with essentially no transverse flow in the direction of the acceleration gap.*

*41. The method according to claim 36, wherein said step of pre-ionizing further comprises inducing an electric field in the region of said gas puff for about 1 μs while maintaining electrical isolation between said fast driving coil and said gas.*

*42. The method according to claim 41, wherein the step of pre-ionizing further comprising discharging an capacitor through said fast driving coil to generate an oscillating electric field.*

*43. The method according to claim 42, further comprising generating an oscillating voltage in said fast driving coil having an oscillation period of less than about 1 μs.*

*44. The method according to claim 36, further comprising the step of adjusting the position of the gas puff prior to the step of pre-ionizing.*

*45. The method according to claim 36, wherein the step of moving said gas away from said fast coil comprises configuring the magnetic field in the region between the fast driving coil and the anode electrode to adjust the location of said magnetically confined plasma layer.*

*46. The method according to claim 45, wherein the step of configuring the magnetic field comprises establishing a slow bias field using the fast driving coil.*

*47. The method according to claim 46, wherein the step of creating a slow bias magnetic field further comprising discharging a bias field capacitor through said fast driving coil through a discharge circuit having a rise time of greater than about 1 μs.*

*48. The method according to claim 47, wherein the step of fully ionizing comprises the step of driving an approximately 1 μs pulse to the fast driving coil.*

*49. The method according to claim 48, wherein the step of driving further comprises discharging a fast capacitor through said fast driving coil to induce a voltage of about 20 kV on the pre-ionized gas to create said plasma.*

*50. The method according to claim 49, further comprising the step of moving the plasma toward the anode electrode in about 1.5 μs or less.*

*51. The method according to claim 49, further comprising the step of maintaining an insulating magnetic field in the acceleration gap prior to the step of applying said pulsed power signal.*

*52. The method according to claim 51, further comprising the step of stagnating said plasma at a separatrix formed by the magnetic fluxes from said fast driving coil and slow driving coil prior to the step of applying said pulsed power signal.*

*53. The method according to claim 36, further comprising the step of maintaining an insulating magnetic field in the acceleration gap prior to the step of applying said pulsed power signal.*

*54. The method according to claim 36, wherein the step of extracting further comprises propagating the ion beam at least 20 cm through an essentially magnetic field free region.*

*55. The method according to claim 36, further comprising the step of selecting the gas to be introduced from gas phase molecules selected from the group comprising hydrogen, helium, oxygen, nitrogen, fluorine, neon, chlorine, argon, lithium, beryllium, boron, carbon, sodium, magnesium, aluminum, silicon, phosphorous, sulfur, and potassium.*

* * * * *